(12) United States Patent
Weingarten et al.

(10) Patent No.: US 9,584,159 B1
(45) Date of Patent: Feb. 28, 2017

(54) INTERLEAVED ENCODING

(71) Applicant: DENSBITS TECHNOLOGIES LTD., Haifa (IL)

(72) Inventors: Hanan Weingarten, Herzelia (IL); Avi Steiner, Kiriat Motzkin (IL)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/323,857

(22) Filed: Jul. 3, 2014

(51) Int. Cl.
| | | |
|---|---|---|
| *H03M 13/00* | (2006.01) | |
| *H03M 13/27* | (2006.01) | |
| *H03M 13/29* | (2006.01) | |

(52) U.S. Cl.
CPC ... *H03M 13/2703* (2013.01); *H03M 13/2906* (2013.01)

(58) Field of Classification Search
CPC ......... H03M 13/2703; H03M 13/2906; H03M 13/611; G06F 11/1068
USPC .................. 714/758, 701, 804, 745, 752
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |

(Continued)

FOREIGN PATENT DOCUMENTS

WO    WO2009053963 A2    4/2009

OTHER PUBLICATIONS

Search Report of PCT Patent Application WO 2009/118720 A3, Mar. 4, 2010.

(Continued)

*Primary Examiner* — Christine Tu

(57) ABSTRACT

A method for interleaved multi-dimensional encoding, the method may include receiving or generating a first version of a group of bits and a second version of the group of bits, wherein the first and second versions differ from each other by an arrangement of bits of the group of bits; and encoding the first and second versions of the groups of bits in an interleaved manner; wherein the encoding comprises calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

18 Claims, 11 Drawing Sheets

(56) References Cited

U.S. PATENT DOCUMENTS

| | | |
|---|---|---|
| 5,745,418 A | 4/1998 | Hu et al. |
| 5,778,430 A | 7/1998 | Ish et al. |
| 5,793,774 A | 8/1998 | Usui et al. |
| 5,805,228 A | 9/1998 | Proctor et al. |
| 5,920,578 A | 7/1999 | Zook et al. |
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,023,783 A | 2/2000 | Divsalar et al. |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,304,985 B1 | 10/2001 | Sindhushayana et al. |
| 6,370,061 B1 | 4/2002 | Yachareni et al. |
| 6,374,383 B1 | 4/2002 | Weng |
| 6,405,341 B1 * | 6/2002 | Maru .................... H03M 13/01 375/262 |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,563,877 B1 | 5/2003 | Abbaszadeh |
| 6,637,002 B1 | 10/2003 | Weng et al. |
| 6,639,865 B2 | 10/2003 | Kwon |
| 6,643,331 B1 | 11/2003 | Farrell et al. |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,735,734 B1 | 5/2004 | Liebetreu et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,143,336 B1 * | 11/2006 | Moon .................. G06F 11/1032 714/755 |
| 7,149,950 B2 | 12/2006 | Spencer et al. |
| 7,173,978 B2 | 2/2007 | Zhang et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,681,105 B1 | 3/2010 | Sim-Tang et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,327,246 B2 | 12/2012 | Weingarten et al. |
| 8,341,502 B2 | 12/2012 | Steiner |
| 8,407,560 B2 | 3/2013 | Ordentlich et al. |
| 8,417,893 B2 | 4/2013 | Khmelnitsky et al. |
| 8,468,431 B2 | 6/2013 | Steiner |
| 8,510,639 B2 | 8/2013 | Steiner |
| 8,700,970 B2 | 4/2014 | Steiner |
| 8,949,700 B2 * | 2/2015 | Azadet ................ H03M 13/256 714/792 |
| 2001/0034815 A1 | 10/2001 | Dugan et al. |
| 2002/0049947 A1 | 4/2002 | Sridharan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |

(56) References Cited

U.S. PATENT DOCUMENTS

| | | |
|---|---|---|
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0104372 A1* | 5/2006 | Coene .............. G11B 20/10009 375/260 |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |

(56) References Cited

U.S. PATENT DOCUMENTS

| | | |
|---|---|---|
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |
| 2013/0132793 A1 | 5/2013 | Ha |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Kcshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISOAS '04, Proceeding of the 2004 International Symposium on Circuits and Systems, published May 23-26, 2004, vol. 2, pp. II-369-72 vol. 2.
Michael Purser, "introduction To Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliabiiity, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

\* cited by examiner

Receiving or generating a first version of a group of bits and a second version of the group of bits, wherein the first and second versions differ from each other by an arrangement of bits of the group of bits. 310

Encoding the first and second versions of the groups of bits in an interleaved manner. 320

Calculating a certain codeword component of a version (of the first and second versions) without taking into account a redundancy of another codeword of another version (of the first and second versions). 311

Calculating at least one codeword component of the first version by encoding a set of bits of the first version and at least a portion of a redundancy of at least one data entity of the second version. 322

Calculating at least one codeword component of the second version by encoding a set of bits of the second version and at least a portion of a redundancy of at least one data entity of the first version. 324

Jointly encoding portions of redundancies of a K'th dimension and portions of redundancies of a lower than K dimension to provide joint redundancy. 330

INTERLEAVED ENCODING

BACKGROUND OF THE INVENTION

Multi-dimensional codes are widely used due to their potential efficiency. In NAND flash memory systems the reliability requirement dictates operation in extremely low output bit error rate (BER), for example, this can be output BER that is below ten by the power of minus fifteen.

For achieving such goal, the encoding system should have a very low error-floor. There are various methods of designing codes and decoder for low error floor. Novel methods for encoding and decoding for obtaining low-error-floor codes are suggested in this application.

SUMMARY

According to an embodiment of the invention there may be provided a method for interleaved multi-dimensional encoding, the method may include receiving or generating a first version of a group of bits and a second version of the group of bits, wherein the first and second versions differ from each other by an arrangement of bits of the group of bits; and encoding, by an encoder, the first and second versions of the groups of bits in an interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

The encoding may include calculating a minority of codeword components of the first version in response to at least portions of data entities of the second version and calculating a majority of codeword components of the first version regardless of the at least portions of data entities of the second version.

The encoding may include calculating a majority of codeword components of the first version in response to at least portions of data entities of the second version and calculating a minority of codeword components of the first version regardless of the at least portions of data entities of the second version.

The at least a portion of a redundancy of a certain data entity of the second version may affect a calculation of only a single codeword component of the first version.

The method may include calculating a certain codeword component of a version of the first and second versions without taking into account a redundancy of another codeword of another version of the first and second versions.

The at least a portion of a redundancy of a certain data entity of the second version may affect a calculation of multiple codeword components of the first version.

The one or more codeword components of the first version may differ by length from one or more codeword components of the second version.

The two or more codeword components of a same version out of the first and second versions may differ by length from each other.

The encoding may include calculating a first codeword component by encoding a first data entity that belongs to of the first version; calculating a second codeword component by encoding, before a completion of an encoding of the first version, a second data entity that belongs to the second version and at least a portion of the first codeword component; calculating a third codeword component by encoding a third data entity that belongs to the first version and at least a portion of the second codeword component; calculating a fourth codeword component by encoding a fourth data entity that belongs to the second version and at least a portion of the third codeword component.

The at least portion of the second codeword component may include one or more second codeword component redundancy bits.

The encoding may include calculating a first codeword component by encoding a first data entity that belongs to of the first version; calculating a second codeword component by encoding a second data entity that belongs to of the second version; calculating a third codeword component by encoding, before a completion of an encoding of the first version, a third data entity that belongs to the first version and at least a portion of the second codeword component; calculating a fourth codeword component by encoding a fourth data entity that belong to the second version and at least a portion of the first codeword component.

The multi-dimensional encoding may include encoding multiple (K) versions of the group of bits that correspond to K dimensions; wherein the method further may include jointly encoding portions of redundancies of a K'th dimension and portions of redundancies of a lower than K dimension to provide joint redundancy.

The joint redundancy may include multiple joint redundancy units, wherein at least one joint redundancy unit is generated by encoding at least a portion of a K'th dimension redundancy unit and at least a portion of a (K−q)'th redundancy portion, q being a positive integer that ranges between 1 and (K−1).

According to an embodiment of the invention there may be provided a method for multi-dimensional encoding, the method may include encoding, by an encoder, multiple versions of a group of bits that correspond to multiple dimensions; and jointly encoding portions of redundancies of a last dimension of the multiple dimensions and portions of redundancies of a not-last dimension to provide joint redundancy.

The joint redundancy may include multiple joint redundancy units, wherein at least one joint redundancy unit is generated by encoding at least a portion of a last dimension redundancy unit and at least a portion of the non-last redundancy portion.

According to an embodiment of the invention there may be provided a method for decoding an interleaved multi-dimensional codeword, the method may include receiving a multi-dimensional codeword that was encoded in an interleaved manner; and decoding, by a decoder, the multi-dimensional codeword; wherein the multi-dimensional codeword was calculated by receiving or generating a first version of a group of bits and a second version of the group of bits, wherein the first and second versions differ from each other by an arrangement of bits of the group of bits; an encoding the first and second versions of the groups of bits in the interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

According to an embodiment of the invention there may be provided a non-transitory computer readable medium that stores instructions that once executed by a computer cause the computer to perform the stages of receiving or generating a first version of a group of bits and a second version of the group of bits, wherein the first and second versions differ from each other by an arrangement of bits of the group of bits; and encoding the first and second versions of the groups of bits in an interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

According to an embodiment of the invention there may be provided a non-transitory computer readable medium that stores instructions that once executed by a computer cause the computer to perform the stages of encoding multiple versions of a group of bits that correspond to multiple dimensions; and jointly encoding portions of redundancies of a last dimension of the multiple dimensions and portions of redundancies of a not-last dimension to provide joint redundancy According to an embodiment of the invention there may be provided a non-transitory computer readable medium that stores instructions that once executed by a computer cause the computer to perform the stages of receiving a multi-dimensional codeword that was encoded in an interleaved manner; and decoding the multi-dimensional codeword; wherein the multi-dimensional codeword was calculated by receiving or generating a first version of a group of bits and a second version of the group of bits, wherein the first and second versions differ from each other by an arrangement of bits of the group of bits; an encoding the first and second versions of the groups of bits in the interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

According to an embodiment of the invention there may be provided a system that may include an encoder; wherein the system is arranged to receive or generate a first version of a group of bits and a second version of the group of bits, wherein the first and second versions differ from each other by an arrangement of bits of the group of bits; and wherein the encoder is arranged to encode the first and second versions of the groups of bits in an interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

According to an embodiment of the invention there may be provided a system that may include an encoder; wherein the encoder is arranged to encode, multiple versions of a group of bits that correspond to multiple dimensions; and jointly encoding portions of redundancies of a last dimension of the multiple dimensions and portions of redundancies of a not-last dimension to provide joint redundancy According to an embodiment of the invention there may be provided a system that may include a decoder; wherein the system is arranged to receive a multi-dimensional codeword that was encoded in an interleaved manner; wherein the decoder is arranged to decode, the multi-dimensional codeword; wherein the multi-dimensional codeword was calculated by receiving or generating a first version of a group of bits and a second version of the group of bits, wherein the first and second versions differ from each other by an arrangement of bits of the group of bits; an encoding the first and second versions of the groups of bits in the interleaved manner; wherein the encoding may include calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 1 illustrates a method according to an embodiment of the invention;

DETAILED DESCRIPTION OF THE DRAWINGS

Figure 2:
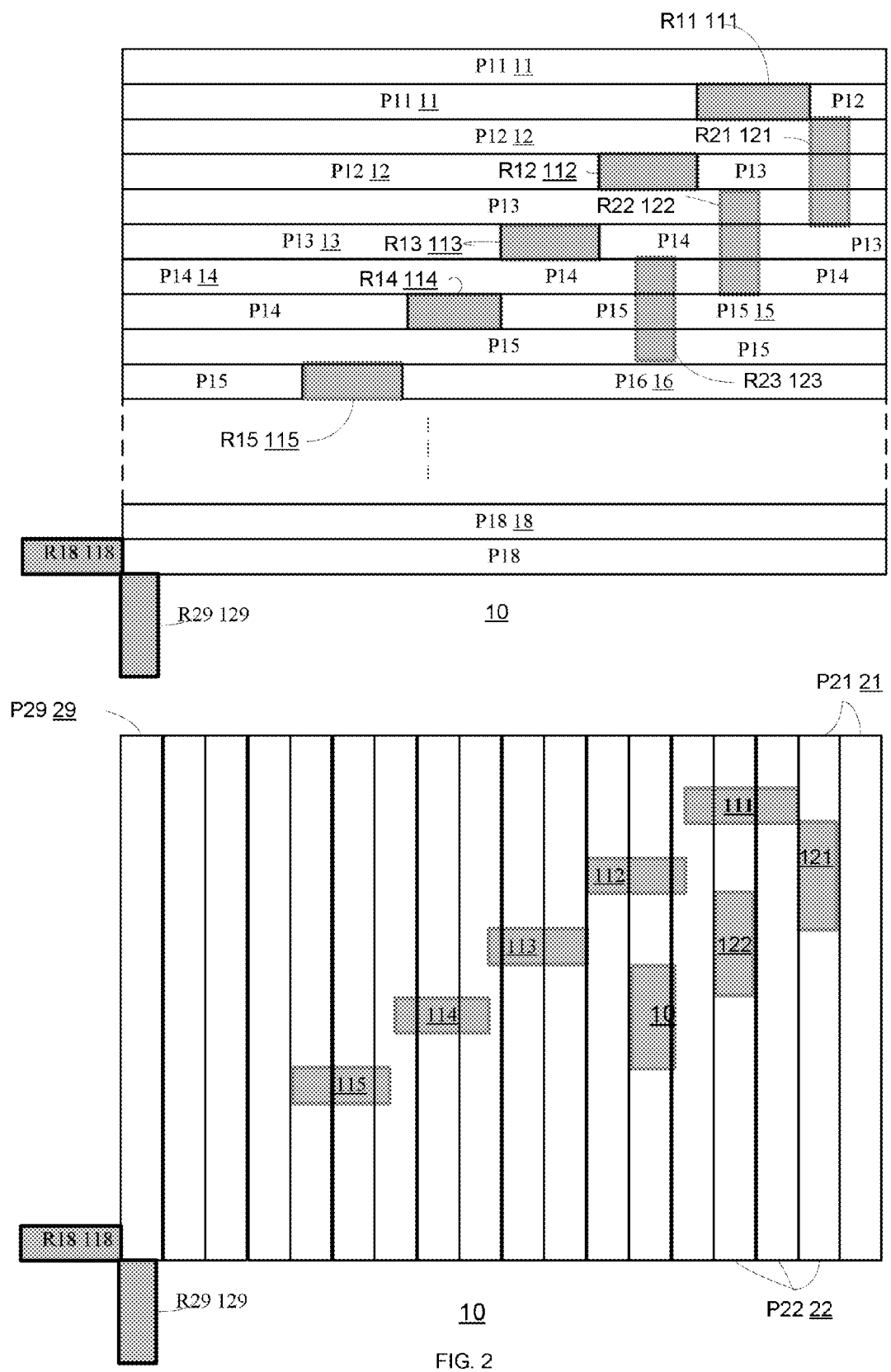
FIGS. 2-5 illustrate codewords according to various embodiments of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Multi-dimensional encoding invoices receiving or generating multiple versions of a group of bits. The different versions differ from each other by the arrangement of bits. Different versions are associated with different dimensions. For example—assuming that that there are two dimensions and that the bits of the group of bits are arranged in a virtual (rectangular) matrix. According to a first arrangement of the bits, (first dimension) payloads are formed by the rows of the matrix. According to a second arrangement of the bits (second dimension) payloads are formed by the columns of the matrix. In a non-folded arrangement each payload occupies a single row or column. In a folded arrangement a single payload (of a single codeword component) can occupy more than a single row or column.

Various examples of multi-dimensional encoding are provided in U.S. Pat. Nos. 8,700,970, 8,341,502, 8,621,321, 8,510,639, 8,468,431, and US patent application 20130132793, all being incorporated herein by reference.

Prior art multi-dimensional encoding included serial concatenation, where a dimension is encoded only after the other dimension was entirely encoded. This way, the redundancy of one dimension is protected by the other dimension. However, the last dimension may be unprotected. Another prior art (3D application) the each dimension encoding generates a redundancy for codeword components of its dimension, the resulting overall redundancy may then be encoded with another encoder. This type of encoding is not too efficient as the redundancy is protected due to an additional code, and does not take part in the encoding process (like suggested in this invention).

According to an embodiment of the invention there is provided an interleaved multi-dimensional encoding scheme in which one or more encoding results of a first dimension affect one or more encoding results of a second dimension and one or more encoding results of the second dimension affect one or more encoding results of the first dimension. The interleaving can be applied on one, some, part or all group of bits of either one of the first and second dimensions. The interleaving may require that the encoding of a dimension out of the first and second dimensions is not completed before starting the encoding of the other dimension.

In the following examples it is assumed that there are two dimensions and that the bits are arranged in a two dimensional matrix. These are only non-limiting assumptions. There may be K dimensions and K may exceed 2. The bits may be arranged in different manners and the matrix is merely provided to simplify the explanation.

FIG. 1 illustrates method 300 according to an embodiment of the invention.

Method 300 may start by stage 310 of receiving or generating a first version of a group of bits and a second version of the group of bits, wherein the first and second versions differ from each other by an arrangement of bits of the group of bits.

One (or none) of the first and second versions may be the data unit. One or both first and second versions may differ from the data unit. One or both of the first and second versions of the data unit may be generated by interleaving.

The first and second versions are associated with first and second dimensions of the multi-dimensional encoding. Thus, encoding the first version may be referred to as first dimension encoding and encoding the second version may be referred to as second dimension encoding.

Stage 310 may be followed by stage 320 of encoding the first and second versions of the groups of bits in an interleaved manner.

Stage 320 may include stages 311, 322 and 324.

Stage 311 may include calculating a certain codeword component of a version (of the first and second versions) without taking into account a redundancy of another codeword of another version (of the first and second versions). For example—the first encoding of the first codeword component of the first or second version can be performed on a payload that may include only data.

Stage 322 may include calculating at least one codeword component of the first version by encoding a set of bits of the first version and at least a portion of a redundancy of at least one data entity of the second version.

Stage 324 may include calculating at least one codeword component of the second version by encoding a set of bits of the second version and at least a portion of a redundancy of at least one data entity of the first version.

Stages 322 and 324 may be executed for encoding a minority, a half, a majority of codeword components of the first version while the remaining (if such exist) codeword components can be calculated regardless of the at least portions of data entities of the second version.

Figure 3:
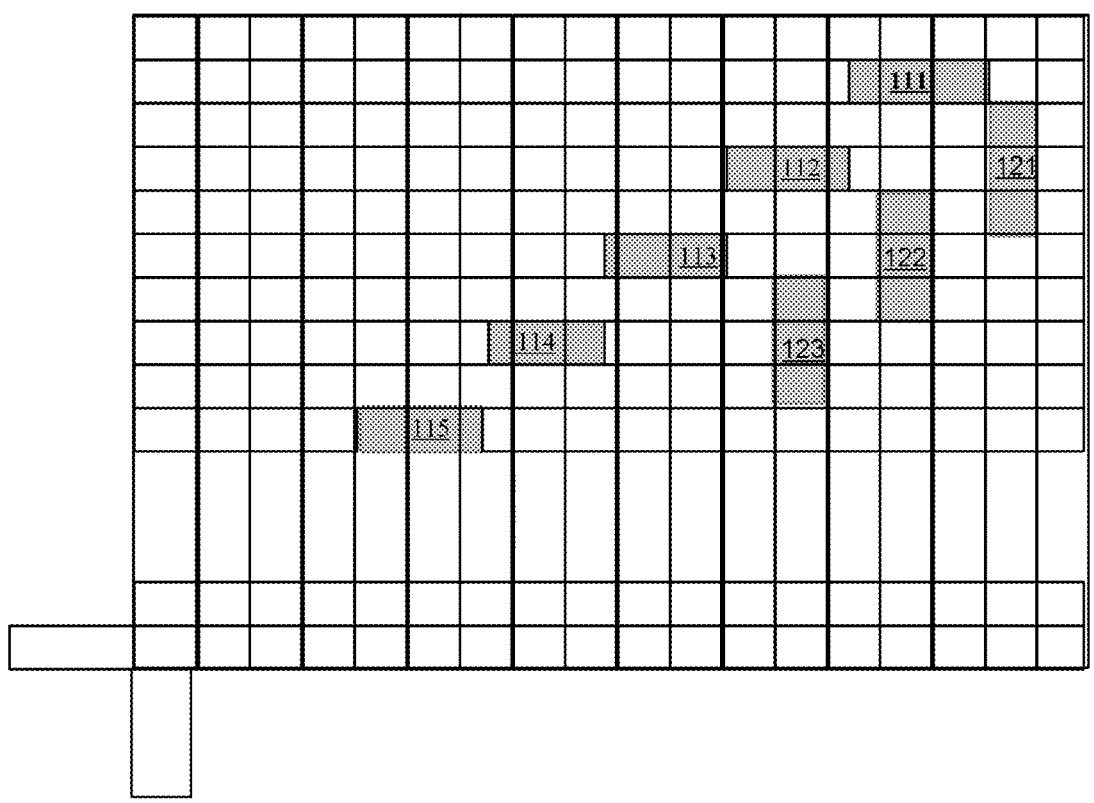
Figure 4:
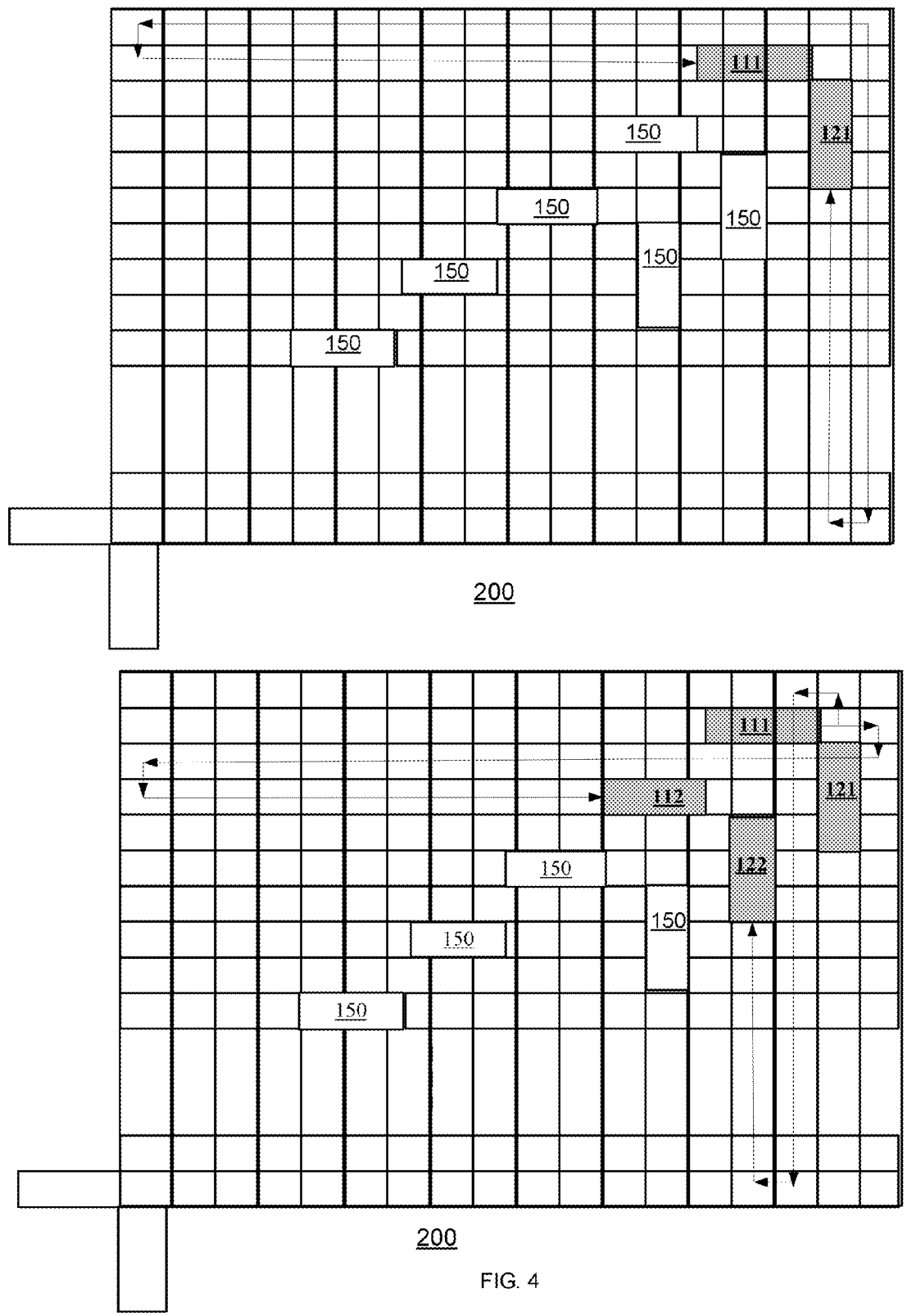

FIGS. 2-4 illustrate a two-dimensional codeword 10 (and 200) that includes row payloads P11-P18 11-18, each extending over more than a single row. First row payload P11 11 includes only bits of a first version of a data unit. Other row payloads P12-P18 include bits of a first version of the data unit as well as redundancy bits of column codeword components. For example, row payloads P12 and P13 include bits of redundancy R21 121. Every codeword component can be for example a short BCH (Bose-Chaudhuri-Hocquenghem) code, or a Hamming code, or any other short block code.

The two-dimensional codeword 10 includes column payloads P21-P29 21-29, each extending over more than a single column. First column payload P21 21 includes only bits of a second version of the data unit. Other column payloads P22-P29 include bits of a second version of the data unit as well as redundancy bits of row codeword components. For example, row payloads P22 and P23 include bits of redundancy R11 111.

Because of the interleaved encoding, the redundancy bits (and the codeword components) are calculated in a serial manner. At any point of time, the redundancy of a codeword component can be calculated if all bits of the payload are available. When some bits are still unknown (for example—are redundancy bits that are not calculated yet) the calculation of the codeword component should be postponed.

This serial nature of the interleaving process is illustrated in FIG. 4. In this figure, gaps are left for redundancy bits that are not calculated yet.

The top part of FIG. 4 illustrates two calculated redundancies R11 111 and R21 121 while other redundancy bits are not calculated yet and there are gaps 150 at the locations of such redundancies.

The lower part of FIG. 4 illustrates four calculated redundancies R11 111, R21 121, R12 112, and R22 122 while other redundancy bits are not calculated yet and there are gaps 150 at the locations of such redundancies. R12 112 and R22 122 can be calculated only after R11 111 and R21 121 are calculated. The arrows demonstrate what part of the payload is used for generating R11 111 and R21 121 in the upper part of the figure, and then R12 112 and R22 122 on the lower part of FIG. 4.

Figure 5:
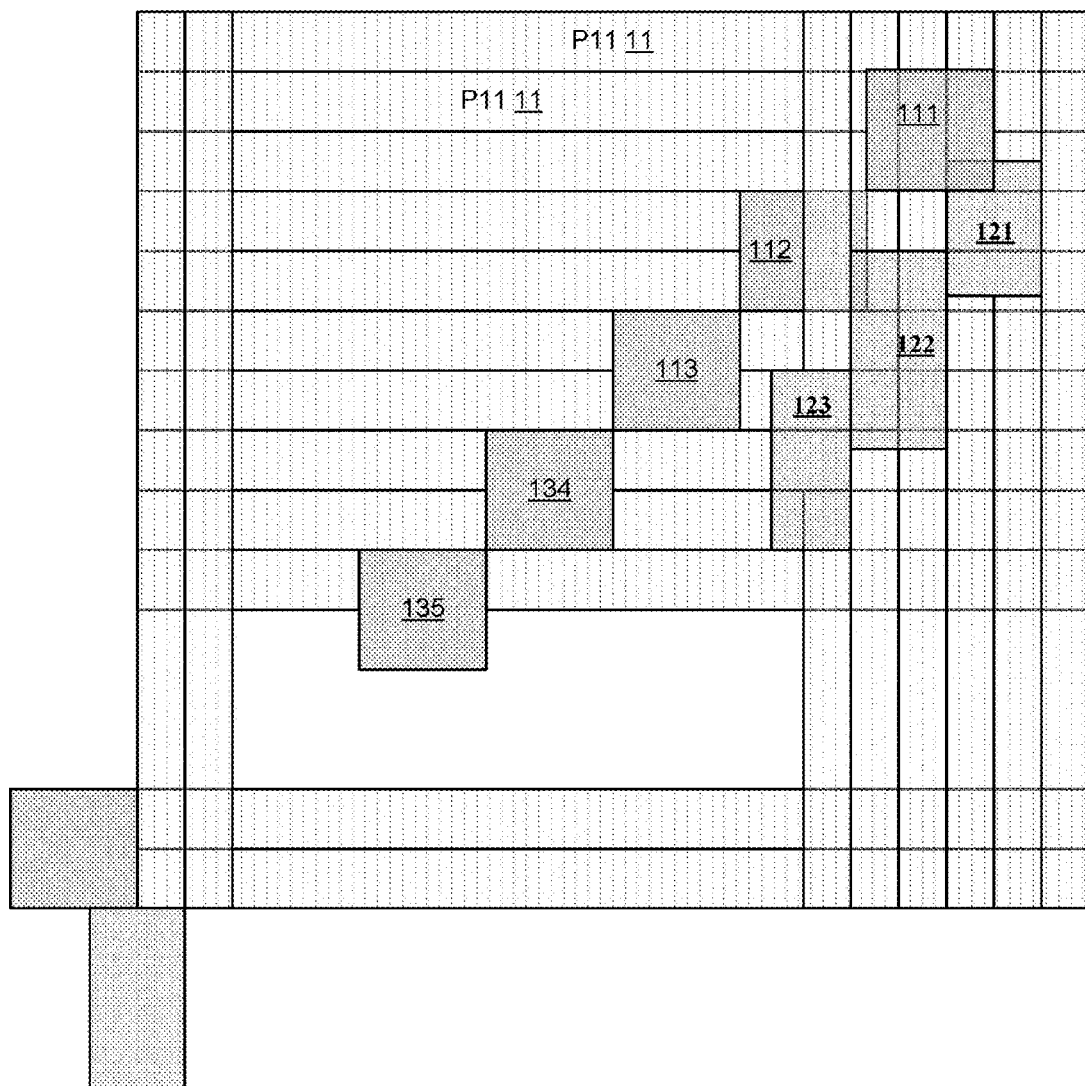

It is noted that the number of row codeword components that can be affected by a redundancy of a single column component code can be one or more. The number of column codeword components that can be affected by a redundancy of a single row component code can be one or more. The payload length for every codeword component may also be different per codeword. A first example of a relationship between row and column component codes are illustrated in FIGS. 2-4. Another example is illustrated in FIG. 5.

It is noted that the interleaved encoding can include jumping between versions after encoding a single payload or after encoding multiple payloads. FIGS. 2-4 illustrated an encoding of a single payload per each version—before jumping to the calculation of the next two codewords. In this case the execution of stage 320 may include:
a. Calculating a first codeword component by encoding a first data entity that belongs to of the first version. For example—calculating R11 111.
b. Calculating a second codeword component by encoding a second data entity that belongs to of the second version. For example—calculating R21 121.
c. Calculating a third codeword component by encoding, before a completion of an encoding of the first version, a third data entity that belongs to the first version and at least a portion of the second codeword component. For example—calculating R12 121.
d. Calculating a fourth codeword component by encoding a fourth data entity that belongs to the second version and at least a portion of the first codeword component. For example—calculating R22 122.

Yet for another example—these stages may include calculating a first codeword component by encoding a first data entity that belongs to the first version; calculating a second codeword component by encoding, before a completion of an encoding of the first version, a second data entity that belongs to the second version and at least a portion of the first codeword component; calculating a third codeword component by encoding a third data entity that belongs to the first version and at least a portion of the second codeword component and calculating a fourth codeword component by encoding a fourth data entity that belongs to the second version and at least a portion of the third codeword component.

According to an embodiment of the invention, the interleaved encoding may be applied to protect redundancies.

In this case, stage 320 may be used for encoding multiple (K) versions of the group of bits that correspond to K dimensions.

Stage 320 may be followed by stage 330 of jointly encoding portions of redundancies of a K'th dimension and portions of redundancies of a lower than K dimension to provide joint redundancy.

The joint redundancy includes multiple joint redundancy units. At least one joint redundancy unit is generated by encoding at least a portion of a K'th dimension redundancy unit and at least a portion of a (K−q)'th redundancy portion, q being a positive integer that ranges between 1 and (K−1).

Figure 6:
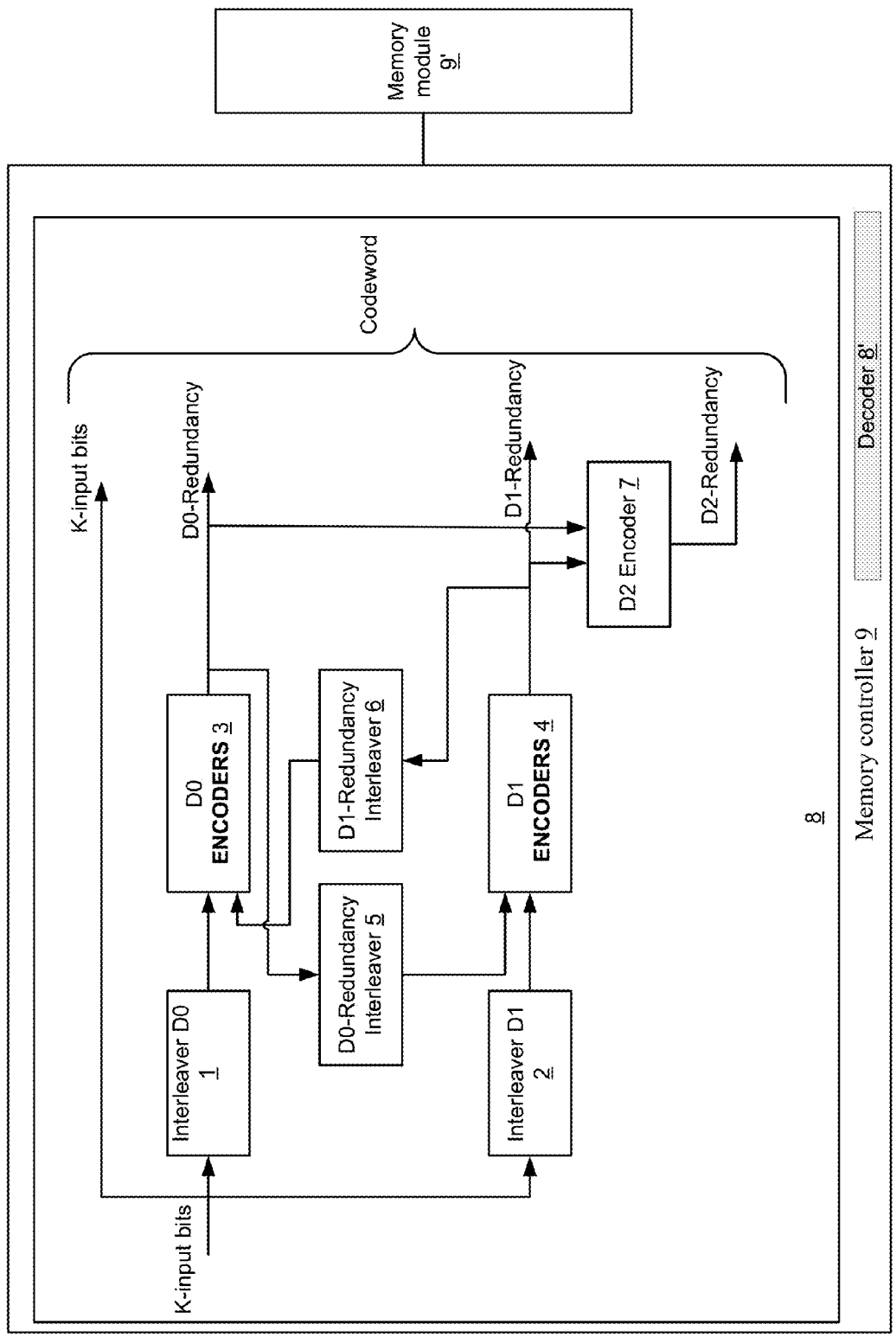
FIG. 6 illustrates a system that includes two dimensional encoder with folded redundancy encoding according to an embodiment of the invention.

FIG. 6 illustrates a system that includes a two dimensional encoder 8 with folded redundancy encoding according to an embodiment of the invention.

The two dimensional encoder 8 may be included in a memory controller 9 that is coupled to a memory module 9' such as a flash memory module. Memory controller 9 may also include an encoder 8'. FIG. 6 illustrates an encoder 8 that outputs a codeword. It may output one or more codeword component of the codeword.

Once a codeword component encoding is completely encoded (encoded codeword is ready, i.e. its redundancy is fully computed), its redundancy is passed to the encoders of the other dimension, and it is taken as additional input data to encoders of the other dimension. Consider for example, K-input bits, which pass through interleaver D0 1 on the first dimension, and through interleaver D1 2 of the other dimension. D0 has multiple encoders (D0 encoders 3) (which in a special case may be identical); each encoder receives a different portion of the D0-interleaved input bits.

D0 encoders 3 begin by encoding packets, which do not need D1-redundancy bits for encoding completion (the minimum is a single packet). Then each time D0 encoders 3 completed the encoding of a packet, it passes the associated redundancy bits through its D0-Redundancy-interleaver 5 to D1 encoders (D1 encoders 4), which use this input for jointly encoding the input data and the input redundancy, at the same time. The same applies to the D1 encoders 4-D1 encoders 4 begins by encoding packets which do not need D0-redundancy bits for encoding completion (the minimum is a single packet). Then each time D1 encoders 4 completed the encoding of a packet, it passes the encoded redundancy bits through its D1-Redundancy-interleaver 6 to D0 encoders (D0 encoders 3), which use this input for jointly encoding the input data and the input redundancy, at the same time.

That is, both D0 and D1 encoders 3 and 4 may operate in parallel (or in a serial manner) in order to provide intermittent results and enable protecting most of the redundancy bits generated by code components with codes on other dimensions. Naturally, the last code component on each dimension will not have an encoded redundancy, since it encodes the last portion of the input bits to the encoder. Therefore, the last few component codes may (optionally) have an additional D2-encoder, which encodes the less protected parity bits. Thus, the systematic codeword consists of K-input bits, D0-Redundancy, D1-Redundancy, and D2-Redundancy.

According to an embodiment of this invention, every codeword component can be of a different code rate. This creates an irregular folded BCH code, and may be used instead of having the D2-encoder. Methods for obtaining different code component strengths include for example, using varying length per component encoder, while using the same BCH parameters (field size—Q, and number of errors—t).

Figure 7:
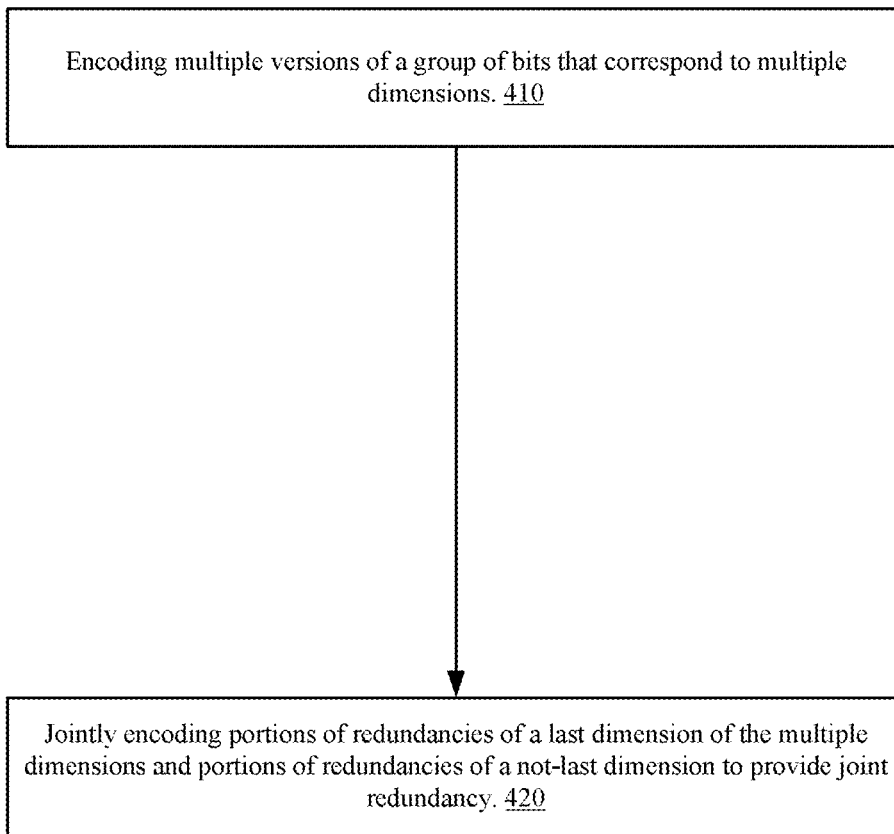
FIG. 7 illustrates a method according to an embodiment of the invention.

FIG. 7 illustrates a method 400 for multi-dimensional encoding, according to an embodiment of the invention.

Method 400 may start by stage 410 of encoding multiple versions of a group of bits that correspond to multiple dimensions. Stage 410 may include any stage of method 300. Other encoding schemes may be used.

Stage 410 may be followed by stage 420 of jointly encoding portions of redundancies of a last dimension of the multiple dimensions and portions of redundancies of a not-last dimension to provide joint redundancy.

The joint redundancy may include multiple joint redundancy units, wherein at least one joint redundancy unit is generated by encoding at least a portion of a last dimension redundancy unit and at least a portion of the non-last redundancy portion.

Figure 8:
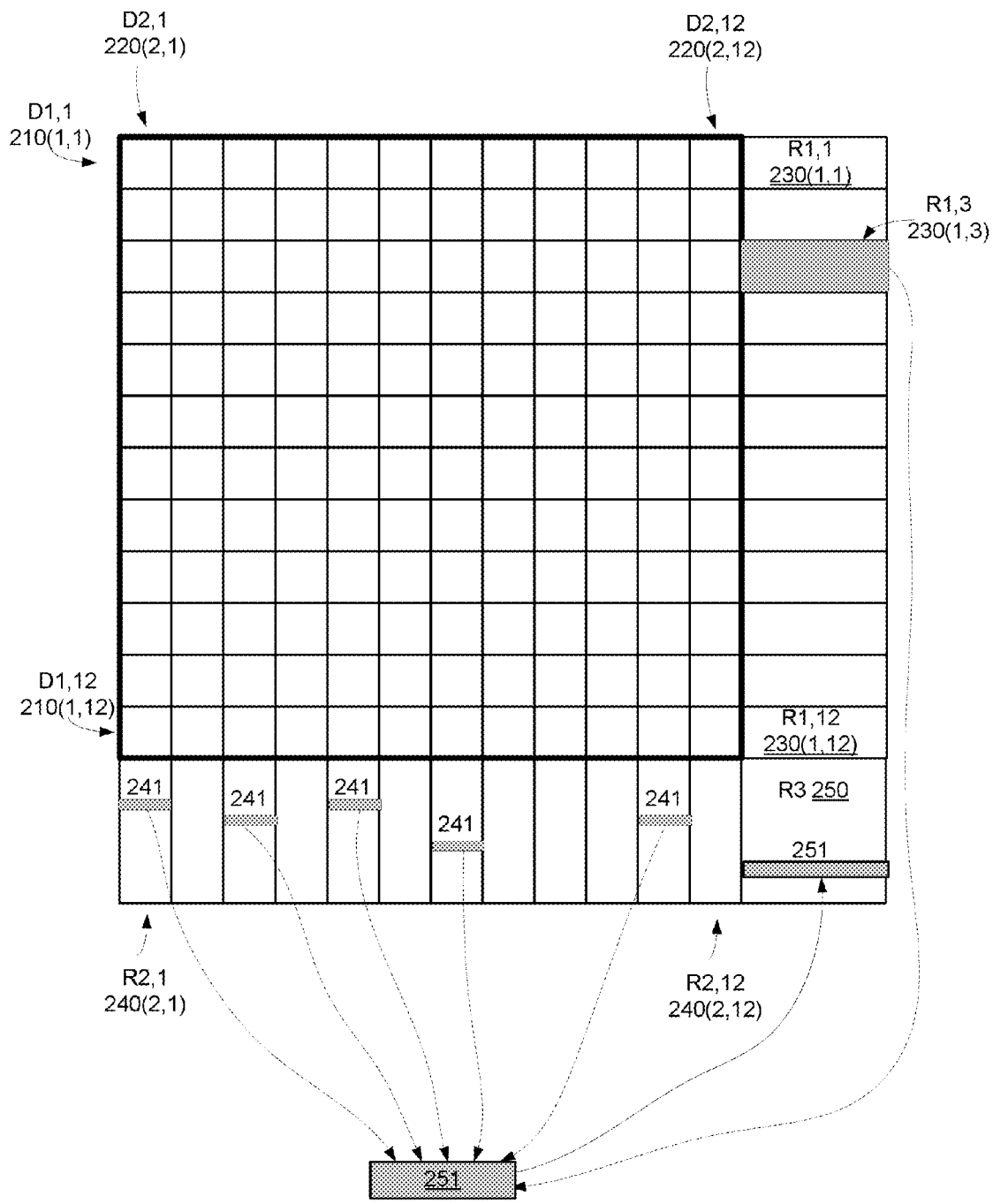
FIGS. 8-10 illustrate a two dimensional codeword according to various embodiments of the invention.
Figure 9:
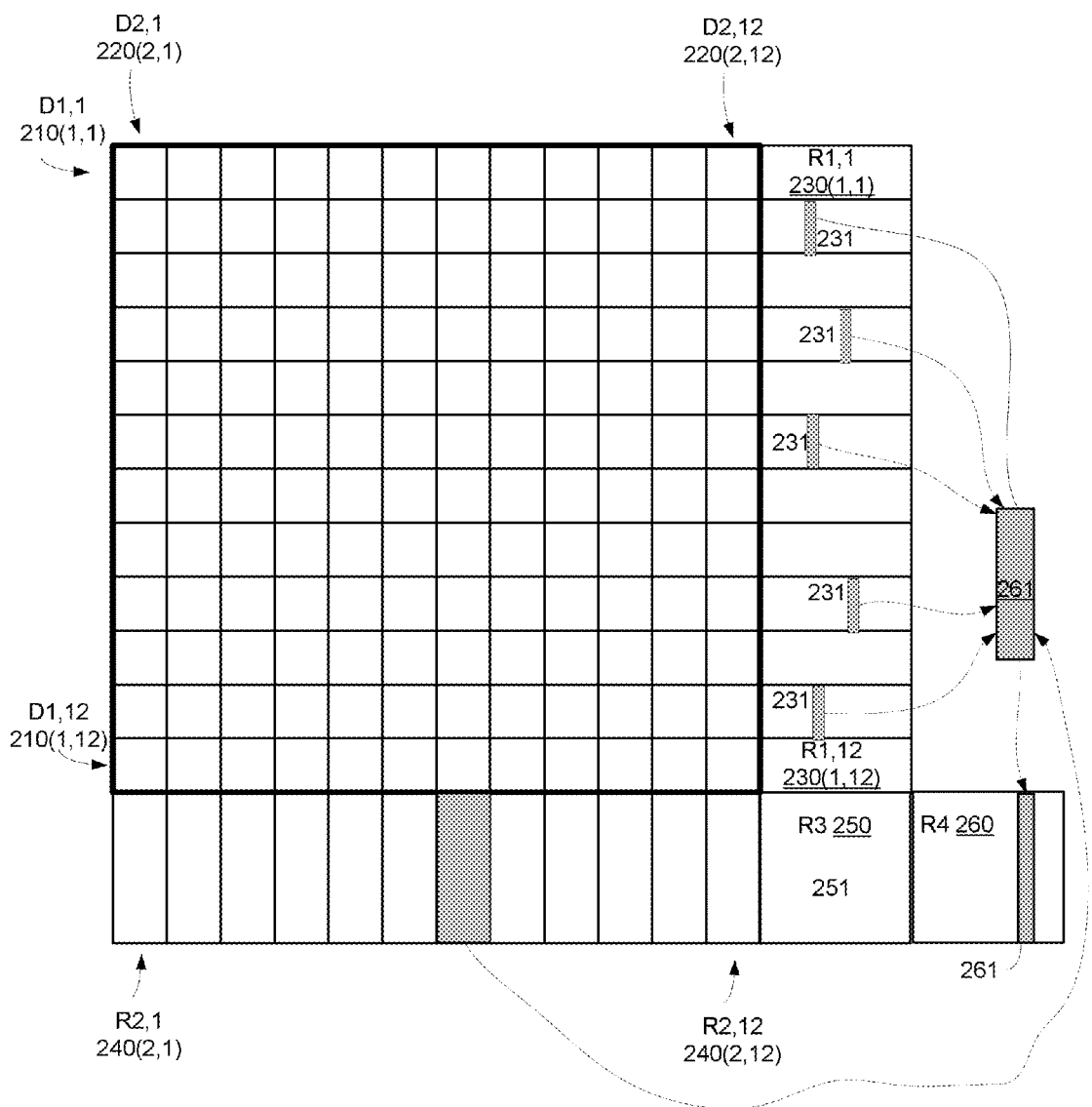
Figure 10:
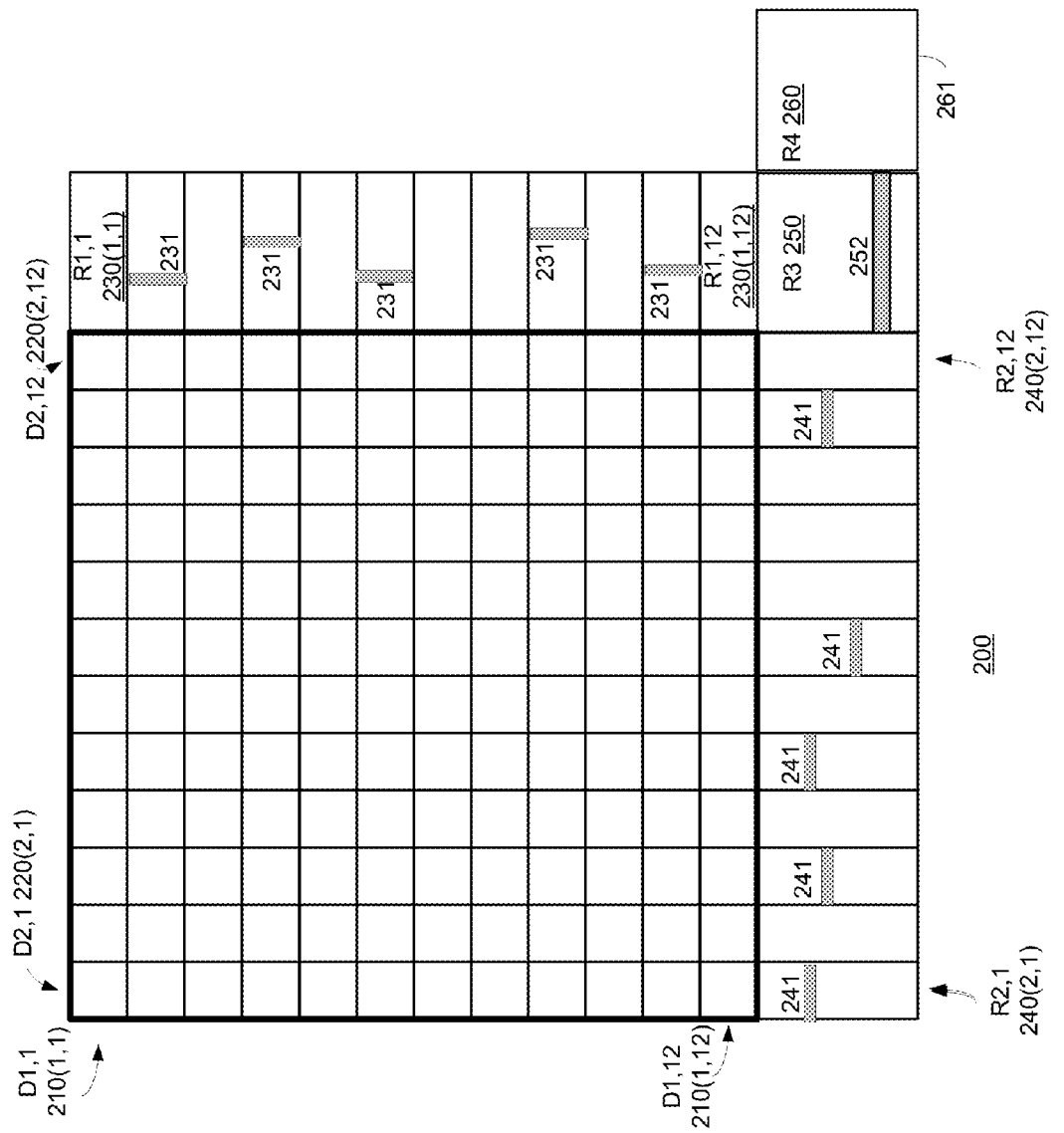
Figure 11:
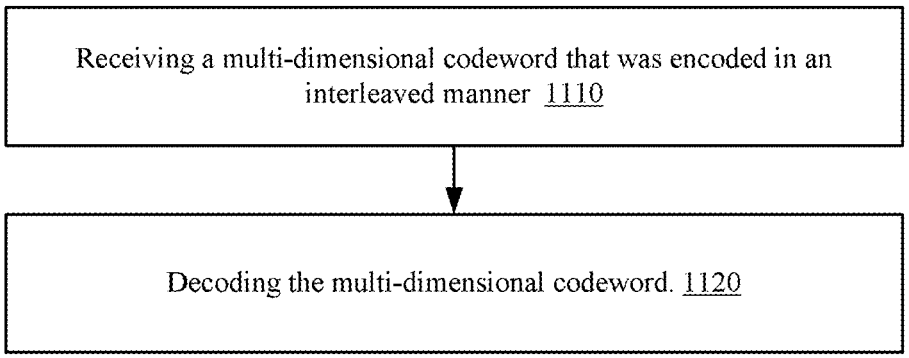
FIG. 11 illustrates a flow chart according to an embodiment of the invention.

FIGS. 8-10 illustrates two dimensional codeword 200 according to various embodiments of the invention. It includes row payloads D1,1-D1,12 210(1,1)-210(1,12) that occupy one row each and include only data bits. It also includes column payloads D2,1-D2,12 220(1,1)-220(1,12) that occupy one row each and include only data bits.

The row payloads (first dimension, first version) were encoded to provide row redundancies R1,1-R1,12 230(1,1)-230(1,12).

The column payloads (second dimension, second version) were encoded to provide column redundancies R2,1-R2,12 240(2,1)-240(2,12).

FIG. 8 illustrates a first joint redundancy R3 250 that includes first joint redundancy units, each is calculated by encoding a single row redundancy and multiple bits from multiple column redundancies. For example first joint redundancy unit 251 is calculated by encoding R1,3 230(1, 3) and multiple bits (241) from multiple column redundancies.

FIG. 9 illustrates a second joint redundancy R4 260 that includes first joint redundancy units, each is calculated by encoding a single column redundancy and multiple bits from multiple row redundancies. For example second joint redundancy unit 261 is calculated by encoding R2,7 240(2,7) and multiple bits (231) from multiple row redundancies.

FIG. 10 illustrates a first joint redundancy R3 250 that includes first joint redundancy units, each is calculated by encoding a multiple bits from multiple column redundancies and multiple bits from multiple column redundancies. For example second joint redundancy unit 252 is calculated by encoding multiple bits (231) from row redundancies and multiple bits (241) from multiple column redundancies. For simplicity of explanation, the arrows connecting the multiple bits (241, 231) to second joint redundancy unit 252 were omitted. FIG. 10 also includes second joint redundancy 260.

It is noted that only one of the first and second joint redundancies can be provided, that the encoding can be applied to more than two dimensions, and that the encoding may be responsive to the data bits and not just to the redundancies.

It is noted that the decoding process may be done in various manners. The decoding can also be iterative decoding. Non-limiting examples of decoding include:
 a. Iterative irregular multi-dimensional decoding (using codeword components of different size and/or different rate).
 b. Using soft decoding with list decoding.
 c. Applying hard and/or soft decoding with false correction elimination (FCE) methods.
 d. Performing hard decoding with intersections decoding.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of a subroutine, a function, a procedure, an object method, an object implementation, an executable application, an applet, a servlet, a source code, an object code, a shared library/dynamic load library, and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. In addition, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. Moreover, if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What we claimed is:

1. A method for interleaved multi-dimensional encoding, comprising:
    receiving or generating a first version of a group of bits and a second version of the group of bits, wherein the first and second versions differ from each other by an arrangement of bits of the group of bits; and
    encoding, by an encoder, the first and second versions of the groups of bits in an interleaved manner; wherein the encoding comprises:
        calculating at least one codeword component of the first version by encoding a set of bits of the first version and at least a portion of a redundancy of at least one data entity of the second version and
        calculating at least one codeword component of the second version by encoding a set of bits of the second version and at least a portion of a redundancy of at least one data entity of the first version.

2. The method according to claim 1 wherein the encoding comprises calculating a minority of codeword components of the first version in response to at least portions of data entities of the second version and calculating a majority of codeword components of the first version regardless of the at least portions of data entities of the second version.

3. The method according to claim 1 wherein the encoding comprises calculating a majority of codeword components of the first version in response to at least portions of data entities of the second version and calculating a minority of codeword components of the first version regardless of the at least portions of data entities of the second version.

4. The method according to claim 1 wherein at least a portion of a redundancy of a certain data entity of the second version affects a calculation of only a single codeword component of the first version.

5. The method according to claim 1 comprising calculating a certain codeword component of a version of the first and second versions without taking into account a redundancy of another codeword of another version of the first and second versions.

6. The method according to claim 1 wherein at least a portion of a redundancy of a certain data entity of the second version affects a calculation of multiple codeword components of the first version.

7. The method according to claim 1 wherein one or more codeword components of the first version differ by length from one or more codeword components of the second version.

8. The method according to claim 1 wherein two or more codeword components of a same version out of the first and second versions differ by length from each other.

9. The method according to claim 1 wherein the encoding comprises:
calculating a first codeword component by encoding a first data entity that belongs to the first version;
calculating a second codeword component by encoding, before a completion of an encoding of the first version, a second data entity that belongs to the second version and at least a portion of the first codeword component;
calculating a third codeword component by encoding a third data entity that belongs to the first version and at least a portion of the second codeword component;
calculating a fourth codeword component by encoding a fourth data entity that belongs to the second version and at least a portion of the third codeword component.

10. The method according to claim 8 wherein the at least portion of the second codeword component comprises one or more second codeword component redundancy bits.

11. The method according to claim 1 wherein the encoding comprises:
calculating a first codeword component by encoding a first data entity that belongs to the first version;
calculating a second codeword component by encoding a second data entity that belongs to of the second version;
calculating a third codeword component by encoding, before a completion of an encoding of the first version, a third data entity that belongs to the first version and at least a portion of the second codeword component;
calculating a fourth codeword component by encoding a fourth data entity that belongs to the second version and at least a portion of the first codeword component.

12. The method according to claim 1 wherein the multi-dimensional encoding comprises encoding multiple (K) versions of the group of bits that correspond to K dimensions; wherein the method further comprises jointly encoding portions of redundancies of a K'th dimension and portions of redundancies of a lower than K dimension to provide joint redundancy.

13. The method according to claim 12 wherein the joint redundancy comprises multiple joint redundancy units, wherein at least one joint redundancy unit is generated by encoding at least a portion of a K'th dimension redundancy unit and at least a portion of a (K−q)'th redundancy portion, q being a positive integer that ranges between 1 and (K−1).

14. A method for multi-dimensional encoding, the method comprises:
encoding, by an encoder, multiple versions of a group of bits that correspond to multiple dimensions; and
jointly encoding portions of redundancies of a last dimension of the multiple dimensions and portions of redundancies of a not-last dimension to provide joint redundancy.

15. The method according to claim 13 wherein the joint redundancy comprises multiple joint redundancy units, wherein at least one joint redundancy unit is generated by encoding at least a portion of a last dimension redundancy unit and at least a portion of the non-last redundancy portion.

16. A method for decoding an interleaved multi-dimensional codeword, the method comprises:
receiving a multi-dimensional codeword that was encoded in an interleaved manner; and
decoding, by a decoder, the multi-dimensional codeword; wherein the multi-dimensional codeword that was encoded in an interleaved manner; and
decoding, by a decoder, the multi-dimensional codeword; wherein the multi-dimensional codeword was calculated by receiving or generating a first version of a group of bits and a second version of the group of bits, wherein the first and second versions differ from each other by an arrangement of bits of the group of bits; an encoding the first and second versions of the groups of bits in the interleaved manner; wherein the encoding comprises:
calculating at least one codeword component of the first version by encoding a set of bits of the first version and at least a portion of a redundancy of at least one data entity of the second version and calculating at least one codeword component of the second version by encoding a set of bits of the second version and at least a portion of a redundancy of at least one data entity of the first version.

17. A non-transitory computer readable medium that stores instructions that once executed by a computer cause the computer to perform the stages of:
receiving or generating a first version of a group of bits and a second version of the group of bits, wherein the encoding comprises:
calculating at least one codeword component of the first version by encoding a set of bits of the first version and at least a portion of a redundancy of at least one data entity of the second version and
calculating at least one codeword component of the first version by encoding a set of bits of the first version and at least a portion of a redundancy of at least one data entity of the second version and
calculating at least one codeword component of the second version by encoding a set of bits of the second version and at least a portion of a redundancy of at least one data entity of the first version.

18. A memory controller comprising an encoder;
wherein the memory controller is arranged to receive or generate a first version of a group of bits and a second version of the group of bits, wherein the first and second versions differ from each other by an arrangement of bits of the group of bits; and wherein the encoder is arranged to encode the first and second versions of the groups of bits in an interleaved manner; wherein the encoding comprises:
  calculating at least one codeword component of the first version by encoding a set of bits of the first version and at least a portion of a redundancy of at least one data entity of the second version and
  calculating at least one codeword component of the second version by encoding a set of bits of the second version and at least a portion of a redundancy of at least one data entity of the first version.

* * * * *